United States Patent
Lee et al.

(10) Patent No.: US 10,752,718 B2
(45) Date of Patent: Aug. 25, 2020

(54) PHOTOCURABLE RESIN COMPOSITION AND METHOD OF FORMING PATTERNS USING THE SAME

(71) Applicant: CHEM OPTICS INC., Daejeon (KR)

(72) Inventors: Hyung-Jong Lee, Sejong (KR); Nam Seob Baek, Daejeon (KR); Jonghwi Lee, Daejeon (KR); Yun Jung Seo, Daejeon (KR); Hyun Jin Yoo, Daejeon (KR)

(73) Assignee: CHEM OPTICS INC., Daejeon (KR)

( * ) Notice: Subject to any disclaimer, the term of this patent is extended or adjusted under 35 U.S.C. 154(b) by 29 days.

(21) Appl. No.: 15/312,883

(22) PCT Filed: Oct. 5, 2016

(86) PCT No.: PCT/KR2016/011109
§ 371 (c)(1),
(2) Date: Nov. 21, 2016

(87) PCT Pub. No.: WO2017/069431
PCT Pub. Date: Apr. 27, 2017

(65) Prior Publication Data
US 2018/0215850 A1 Aug. 2, 2018

(30) Foreign Application Priority Data
Oct. 21, 2015 (KR) .................. 10-2015-0146451

(51) Int. Cl.
*C08F 222/18* (2006.01)
*C08F 220/22* (2006.01)
(Continued)

(52) U.S. Cl.
CPC .............. *C08F 222/18* (2013.01); *C08F 2/48* (2013.01); *C08F 220/22* (2013.01);
(Continued)

(58) Field of Classification Search
CPC ........ C08F 222/18; C08F 220/22; C08F 2/48; C08F 236/16; G03F 7/027; G03F 7/0755;
(Continued)

(56) References Cited

U.S. PATENT DOCUMENTS

| 6,555,288 B1 * | 4/2003 | Xu ...................... C08F 22/18 |
| | | 430/270.1 |
| 6,800,424 B2 * | 10/2004 | Xu ...................... C08F 22/18 |
| | | 385/122 |

(Continued)

FOREIGN PATENT DOCUMENTS

| JP | 2013179159 A | * | 9/2013 |
| JP | 2013179159 A | | 9/2013 |

(Continued)

*Primary Examiner* — Robert C Dye
*Assistant Examiner* — Taryn Trace Willett
(74) *Attorney, Agent, or Firm* — McCoy Russell LLP

(57) ABSTRACT

The present invention relates to a photocurable resin composition usable in a nanoimprint process which is capable of overcoming low productivity of conventional semiconductor processes for optical devices and electronic devices, and a method of forming patterns using the same. Specifically, the present invention relates to a photocurable resin composition including a specific perfluorinated acrylic compound for improving release property between a nanoimprint mold and the photocurable resin composition, and a method of forming patterns using the same.

4 Claims, 1 Drawing Sheet

(51) Int. Cl.
| | |
|---|---|
| *C08F 236/16* | (2006.01) |
| *C08F 2/48* | (2006.01) |
| *G03F 7/027* | (2006.01) |
| *G03F 7/075* | (2006.01) |
| *G03F 7/004* | (2006.01) |
| *C09D 135/02* | (2006.01) |
| *G03F 7/00* | (2006.01) |
| *G03F 7/031* | (2006.01) |
| *G03F 7/16* | (2006.01) |
| *G03F 7/20* | (2006.01) |

(52) U.S. Cl.
CPC .......... *C08F 236/16* (2013.01); *C09D 135/02* (2013.01); *G03F 7/0002* (2013.01); *G03F 7/0046* (2013.01); *G03F 7/027* (2013.01); *G03F 7/031* (2013.01); *G03F 7/0755* (2013.01); *G03F 7/162* (2013.01); *G03F 7/2004* (2013.01)

(58) Field of Classification Search
CPC ...... G03F 7/0046; G03F 7/162; G03F 7/2004; G03F 7/0002; G03F 7/031; C09D 135/02
See application file for complete search history.

(56) References Cited

U.S. PATENT DOCUMENTS

| | | | | |
|---|---|---|---|---|
| 7,078,157 | B2* | 7/2006 | Zhuang | G03F 7/033 430/281.1 |
| 8,263,129 | B2* | 9/2012 | DeSimone | A61K 9/0097 424/489 |
| 8,575,300 | B2* | 11/2013 | Hung | C08F 261/06 528/271 |
| 2010/0132989 | A1* | 6/2010 | Fujihara | C08G 73/1035 174/258 |
| 2016/0002488 | A1* | 1/2016 | Takao | C09D 4/00 428/421 |

FOREIGN PATENT DOCUMENTS

| | | |
|---|---|---|
| JP | 5513614 B2 | 6/2016 |
| KR | 1020030086583 A | 11/2003 |
| KR | 1020050118272 A | 12/2005 |
| KR | 1020120105062 A | 9/2012 |

* cited by examiner

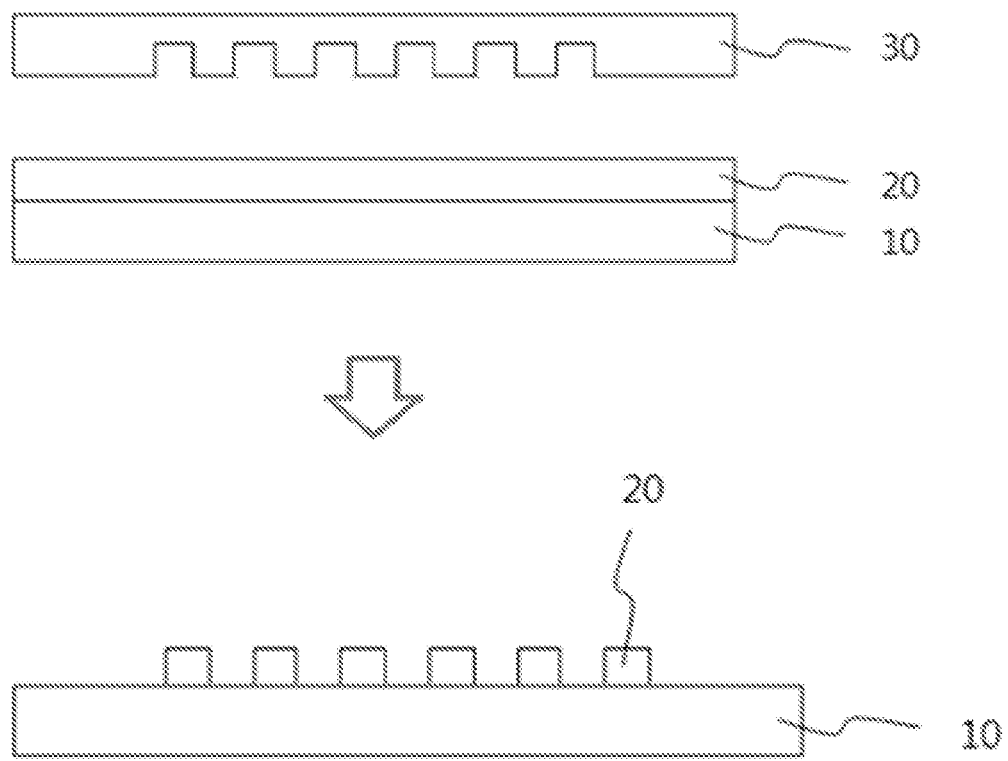

PHOTOCURABLE RESIN COMPOSITION AND METHOD OF FORMING PATTERNS USING THE SAME

CROSS-REFERENCE TO RELATED APPLICATIONS

The present application is a U.S. National Phase of International Patent Application Serial No. PCT/KR2016/011109, entitled "PHOTOCURABLE RESIN COMPOSITION AND METHOD OF FORMING PATTERNS USING THE SAME," filed on Oct. 5, 2016. International Patent Application Serial No. PCT/KR2016/011109 claims priority to Korean Patent Application No. 10-2015-0146451, filed on Oct. 21, 2015. The entire contents of each of the above-cited applications are hereby incorporated by reference for all purposes.

TECHNICAL FIELD

The present invention relates to a photocurable resin composition usable in a nanoimprint process which is capable of overcoming low productivity of conventional semiconductor processes for optical devices and electronic devices, and a method of forming patterns using the same, and more specifically, to a photocurable resin composition including a perfluorinated acrylic compound for improving release property between a nanoimprint mold and the photocurable resin composition, and a method of forming patterns using the same.

BACKGROUND ART

A nanoimprint method refers to a technique of precisely transferring fine patterns by compressing a mold machine (for example, referred to as a mold, a stamp, and a template) having concavo-convex patterns formed thereon to a resist, and mechanically deforming the mold. Once the mold machine is manufactured, a fine structure such as a nanostructure, etc., may be simply and repeatedly molded, and the nanoimprint method is simple and significantly economical as compared to conventional photolithography methods, and thus, it has been highlighted as an appropriate technology for mass production while ensuring economic feasibility and reliability in not only a semiconductor, but also a display device, an optical device having a nanostructure form, etc.

The conventional resin composition used in the nanoimprint method includes an acrylic compound, a fluorine-based compound, and the like. Here, after the resin composition is applied to a silicon wafer (Si wafer), a glass substrate, a polymer substrate, etc., and compressed to a mold having the fine structure, followed by heat or light irradiation, the resin composition has poor release property at the time of removing the mold, such that the mold, which is relatively expensive, is easily damaged, which causes difficulty in repeatedly manufacturing nanostructures. The fluorine-based compound has a weak interfacial adhesion force, and thus, the resin may be easily peeled. Recently, the nanoimprint process using UV uses a low-viscosity photocurable resin to easily penetrate the resin between transparent stamp patterns, followed by compressing the resin at a low pressure at room temperature, and irradiating UV light to form a nanostructure. This method is able to minimize stamp damage relatively, but it is difficult to manufacture the high-priced transparent stamp. Even if a replication stamp is used, in order to reduce adhesion force between the stamp and the resin, the stamp is required to be formed on a substrate with protective films such as a fluorine-based self-assembled monolayer, etc., by liquid or vapor deposition.

Therefore, the present inventors made an effort to provide a low-viscosity photocurable resin composition having excellent gap fill property even at the time of being applied to a substrate having steps, and improved release property between a nanoimprint mold and the resin composition, and a method of forming patterns using the same, and completed the present invention.

DISCLOSURE

Technical Problem

An object of the present invention is to provide a photocurable resin composition having a low surface energy to minimize bonding force with a nanoimprint mold, thereby further improving release property, and having a low viscosity to be easily penetrated between mold patterns at room temperature.

Technical Solution

In one general aspect, a photocurable resin composition includes: a fluorine-based acrylic compound (A) represented by Chemical Formula 1 below, an acrylic compound (B) having one or two photopolymerizable functional group(s) in a molecule, and a photoinitiator (D),

[Chemical Formula 1]

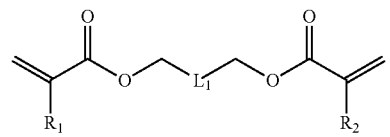

in Chemical Formula 1, $R_1$ and $R_2$ are each independently hydrogen or (C1-C10) alkyl; and $L_1$ is —$(CF_2)_n$— or —$CF_2(OCF_2CF_2)_m$—$OCF_2$—, n is an integer selected from 2 to 10, and m is an integer selected from 1 to 5.

The acrylic compound (B) may be one or more selected from acrylic compounds represented by Chemical Formulas 2 and 3 below, but is not limited thereto:

[Chemical Formula 2]

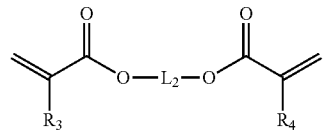

[Chemical Formula 3]

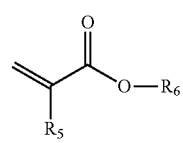

in Chemical Formulas 2 and 3, $R_3$, $R_4$ and $R_5$ are each independently hydrogen or (C1-C10)alkyl;

$R_6$ is hydrogen, (C1-C10)alkyl, (C3-C20)cycloalkyl, (C3-C20)heterocycloalkyl, (C6-C20)aryl(C1-C10)alkyl, (C6-C20)aryl, (C3-C20)heteroaryl, di(C1-C10)alkylsilyl, tri(C1-C10)alkylsilyl, di(C1-C10)alkoxysilyl, tri(C1-C10)alkoxysilyl, di(C1-C10)alkyl(C6-C20)arylsilyl, tri(C6-C20)arylsilyl or

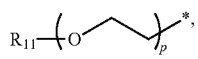

p is an integer from 1 to 5, and $R_{11}$ is hydrogen, (C1-C10)alkyl or (C6-C20)aryl;

$L_2$ is a single bond, (C1-C10)alkylene, (C6-C20)arylene or

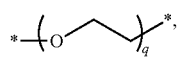

and q is an integer of 1 to 5; and the alkyl, aryl-substituted alkyl, cycloalkyl, heterocycloalkyl, aryl, alkylaryl, heteroaryl, trialkylsilyl, dialkylarylsilyl, triarylsilyl of $R_6$, and the alkylene and arylene of $L_2$ may be each independently substituted with one or more substituents independently selected from the group consisting of fluorine, cyano, nitro, $—OR_{21}$, $—SR_{21}$, $(C_6-C_{10})$aryl, $—O(C_6-C_{10})$aryl, hydroxy$(C_1-C_8)$alkyl, halo$(C_1-C_7)$alkyl, $—Si—(OR_{21})_3$, $—NR_{21}R_{22}$—$C(O)R_{21}$, $—COOR_{21}$ and $—C(O)NR_{21}R_{22}$, wherein $R_{21}$ to $R_{23}$ are each independently (C1-C10)alkyl, (C3-C20)cycloalkyl, (C3-C20)heterocycloalkyl, (C6-C20)aryl or (C3-C20)heteroaryl, and the heterocycloalkyl and heteroaryl include one or more heteroatoms selected from B, N, O, S, P(=O), Si and P.

The acrylic compound (B) may be one or more selected from 3,5,7,9-tetraoxa-4,6,8-trisilaundecane-1,11-diol dimethacrylate, 4,6,8-hexamethyl-3,5,7,9-tetraoxa-4,6,8-trisilaundecane-1,11-diol dimethacrylate, 4,6,8-trimethyl-4,6,8-triphenyl-3,5,7,9-tetraoxa-4,6,8-trisilaundecane-1,11-diol dimethacrylate, 1,4-cyclohexanedimethanol-1,4-diacrylate, diethyleneglycol diacrylate, triethyleneglycol dimethacrylate, triethyleneglycol diacrylate, polyethyleneglycol diacrylate, dipropylene glycol diacrylate, tripropylene glycol diacrylate, dimethylol tricyclodecane diacrylate, dimethylol tricyclodecane dimethacrylate, 2-phenoxyethyl acrylate, 2-phenoxyethyl methacrylate, 3-phenoxybenzyl acrylate, 3-phenoxybenzyl methacrylate, phenoxy tetraethyleneglycol acrylate, phenoxy triethyleneglycol acrylate, phenoxy diethyleneglycol acrylate, phenoxy polyethyleneglycol acrylate, phenoxy tetraethyleneglycol methacrylate, phenoxy triethyleneglycol methacrylate, phenoxy diethyleneglycol methacrylate, methoxy polyethyleneglycol methacrylate, tetrahydrofuryl acrylate, cyclohexyl methacrylate, isobornyl acrylate, dicyclopentenyl acrylate, dicyclopentenyloxyethyl methacrylate, dicyclopentanyl acrylate, 3-(methacryloxypropyl)trimethoxysilane, 3-acryloxypropyl trimethoxysilane, and methacryloxy trimethoxysilane, etc., but is not limited thereto.

The compound (C) may be one or more selected from trimethylolpropane tris(3-mercaptopropionate), tris(2-hydroxyethyl isocyanurate)triacrylate, trimethylolpropane triacrylate, trimethylolpropane trimethacrylate, pentaerythritol tetraacrylate, and dipentaerythritol hexaacrylate, etc., but is not limited thereto.

$R_1$ and $R_2$ of the fluorine-based acrylic compound (A) represented by Chemical Formula 1 may be each independently hydrogen or (C1-C7)alkyl, and m may be an integer of 1 or 2.

The photocurable resin composition may further include: a compound (C) having three or more functional groups selected from the photopolymerizable functional group in a molecule, and a functional group capable of reacting with the photopolymerizable functional group.

In another general aspect, a method of forming patterns includes: forming a fine pattern layer by applying a photocurable resin composition to one surface of a substrate and releasing the composition into a mold, the composition including a fluorine-based acrylic compound (A) represented by Chemical Formula 1 below, an acrylic compound (B) having one or two photopolymerizable functional group(s) in a molecule, and a photoinitiator (D); and photocuring by irradiating light to the fine pattern layer:

[Chemical Formula 1]

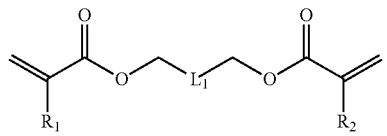

in Chemical Formula 1, $R_1$ and $R_2$ are each independently hydrogen or (C1-C10)alkyl; and $L_1$ is $—(CF_2)_n—$ or $—CF_2(OCF_2CF_2)_m—OCF_2—$, n is an integer selected from 2 to 10, and m is an integer selected from 1 to 5.

Advantageous Effects

The photocurable resin composition according to the present invention may be easily applied due to a low viscosity, may reduce effort and time required in forming an additional protective layer in a mold due to a low surface energy, and may implement excellent release property.

In addition thereto, the photocurable resin composition according to the present invention may simultaneously have a photopolymerizable functional group and a functional group capable of reacting with the photopolymerizable functional group, to have excellent gap fill property even when the resin composition is applied to a substrate having steps, thereby providing uniform patterns in a large area.

DESCRIPTION OF DRAWINGS

FIG. 1 shows a method of forming patterns using a composition according to the present invention.

DETAILED DESCRIPTION OF MAIN ELEMENTS

10: Substrate
20: Resin composition
30: Stamp

BEST MODE

Hereinafter, a photocurable resin composition and a method of forming patterns using the same according to the present invention will be described in more detail through Examples including the accompanying drawings. Meanwhile, the following exemplary embodiments and Examples are provided as a reference for explaining the present invention in detail, and therefore, the present invention is not limited thereto, but may be implemented in various ways.

Unless defined otherwise, all technical and scientific terms used herein have the same meanings generally understood by those skilled in the art to which the present invention pertains, and terms used in the detailed description of the present invention effectively describe specific exemplary embodiments, and are not intended to limit the present invention.

Terms 「alkyl」, 「alkoxy」, and other substituents including 「alkyl」 part described in the present invention include all linear or branched forms. In addition, 「aryl」 described in the present invention, which is an organic radical derived from aromatic hydrocarbon by removal of one hydrogen, includes a single ring system or a fused ring system suitably including 4 to 7 ring atoms, preferably, 5 or 6 ring atoms in each ring, and even includes a form in which a plurality of aryls are connected by a single bond. Specific examples of the aryl may include phenyl, naphthyl, biphenyl, anthryl, indenyl, fluorenyl, etc., but the present invention is not limited thereto. Further, term 「heteroaryl」 described in the present invention, which is an organic radical derived from aromatic hydrocarbon by removal of one hydrogen, may be a monocyclic or polycyclic aromatic hydrocarbon radical including 3 to 8 ring atoms that include one or more heteroatoms selected from B, N, O, S, P(=O), Si and P, and includes a single ring system or a fused ring system suitably including 3 to 7 ring atoms, preferably, 5 or 6 ring atoms in each ring, and even includes a form in which a plurality of heteroaryls are connected to each other by a single bond.

Term 「cycloalkyl」 described in the present invention means a completely saturated and a partially unsaturated hydrocarbon ring including 3 to 9 carbon atoms, and includes fused aryl or heteroaryl. Term 「heterocycloalkyl」 described in the present invention may be a monocyclic or polycyclic non-aromatic radical including 4 to 10 ring atoms that include one or more heteroatoms selected from B, N, O, S, P(=O), Si and P.

The photocurable resin composition for imprinting according to the present invention may have high transparency, and may form a cured film, a nanostructure, etc., having remarkably improved close-adhesion with a substrate, and may form fine patterns by using various forms of molds.

In addition, the resin composition according to the present invention may include a fluorine-based acrylic compound (A) represented by Chemical Formula 1 below, an acrylic compound (B) having one or two photopolymerizable functional group(s) in a molecule, and a photoinitiator (D) to suppress swelling or peeling phenomenon, etc., at an interface with a substrate:

[Chemical Formula 1]

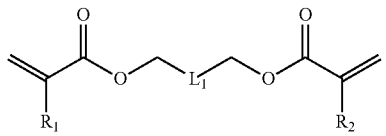

in Chemical Formula 1, $R_1$ and $R_2$ are each independently hydrogen or (C1-C10)alkyl; and $L_1$ is —$(CF_2)_n$— or —$CF_2(OCF_2CF_2)_m$—$OCF_2$—, n is an integer selected from 2 to 10, and m is an integer selected from 1 to 5.

Further, the resin composition according to the present invention may have the above-described composition to exhibit excellent release property even without performing additional release treatment on the mold, such that it is possible to perform continuous transfer, thereby manufacturing a cured film, a nanostructure, etc., using the same with high productivity.

The resin composition according to an exemplary embodiment of the present invention may have the above-described combination to exhibit good miscibility and may implement excellent release property even without performing additional release treatment on the mold. Here, in view of providing more effective release property, $R_1$ and $R_2$ of the fluorine-based acrylic compound (A) represented by Chemical Formula 1 may be each independently hydrogen or (C1-C7)alkyl; and m may be an integer of 1 or 2, preferably, $R_1$ and $R_2$ of the fluorine-based acrylic compound (A) represented by Chemical Formula 1 may be each independently selected from hydrogen, methyl, ethyl, propyl, etc. Further, in view of excellent etching resistance as well as the above-described effects, more preferably, the fluorine-based acrylic compound (A) may be one or more selected from 1H,1H,4H,4H-perfluoro-1,4-butanediol diacrylate, 1H,1H,5H,5H-perfluoro-1,5-pentanediol diacrylate, 1H,1H,6H,6H-perfluoro-1,6-hexanediol diacrylate, 1H,1H,8H,8H-perfluoro-1,8-octanediol diacrylate, 1H,1H,9H,9H-perfluoro-1,9-nonanediol diacrylate, 1H,1H,10H,10H-perfluoro-1,10-decanediol diacrylate, 1H,1H,12H,12H-perfluoro-1,12-undecanediol diacrylate, 1H, 1H,8H,8H-perfluoro-3,6-dioxaoctane-1,8-diol diacrylate), 1H,1H,11H,11H-perfluoro-3,6,9-trioxaundecane-1,11-diol diacrylate ($C_{14}H_{10}F_{12}O_7$), 1H, 1H,14H,14H-perfluoro-3,6,9,12-tetraoxatetradecane-1,14-diol diacrylate ($C_{16}H_{10}F_{16}O_8$), fluorinated polyethylene glycol diacrylate, etc., but is not limited thereto.

Further, the resin composition according to an exemplary embodiment of the present invention may have a combination including one or more selected from acrylic compounds (B) represented by Chemical Formulas 2 and 3 below to improve a gap fill property with the etched substrate:

[Chemical Formula 2]

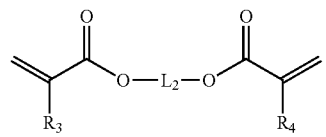

[Chemical Formula 3]

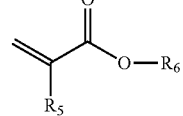

in Chemical Formulas 2 and 3, $R_3$, $R_4$ and $R_5$ are each independently hydrogen or (C1-C10)alkyl;

$R_6$ is hydrogen, (C1-C10)alkyl, (C3-C20)cycloalkyl, (C3-C20)heterocycloalkyl, (C6-C20)aryl(C1-C10)alkyl, (C6-C20)aryl, (C3-C20)heteroaryl, di(C1-C10)alkylsilyl, tri(C1-

C10)alkylsilyl, di(C1-C10)alkoxysilyl, tri(C1-C10) alkoxysilyl, di(C1-C10)alkyl(C6-C20)arylsilyl, tri(C6-C20) arylsilyl or

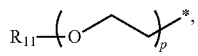

p is an integer of 1 to 5, and $R_{11}$ is hydrogen, (C1-C10)alkyl or (C6-C20)aryl;

$L_2$ is a single bond, (C1-C10)alkylene, (C6-C20)arylene or

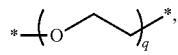

and q is an integer of 1 to 5; and the alkyl, aryl-substituted alkyl, cycloalkyl, heterocycloalkyl, aryl, alkylaryl, heteroaryl, trialkylsilyl, dialkylarylsilyl, triarylsilyl of $R_6$, and the alkylene and arylene of $L_2$ may be each independently substituted with one or more substituents independently selected from the group consisting of fluorine, cyano, nitro, —$OR_{21}$, —$SR_{21}$, ($C_6$-$C_{10}$)aryl, —$O(C_6$-$C_{10})$aryl, hydroxy($C_1$-$C_5$)alkyl, halo($C_1$-$C_7$)alkyl, —Si—$(OR_{21})_3$, —$NR_{21}R_{22}$—$C(O)R_{21}$, —$COOR_{21}$ and —$C(O)NR_{21}R_{22}$, wherein $R_{21}$ to $R_{23}$ are each independently (C1-C10)alkyl, (C3-C20)cycloalkyl, (C3-C20)heterocycloalkyl, (C6-C20)aryl or (C3-C20)heteroaryl, and the heterocycloalkyl and heteroaryl include one or more heteroatoms selected from B, N, O, S, P(=O), Si and P.

Here, it is preferred that the acrylic compound (B) simultaneously includes a photopolymerizable functional group and a functional group capable of reacting with the photopolymerizable functional group, wherein the photopolymerizable functional group may be an acrylic group, etc., and the functional group capable of reacting with the photopolymerizable functional group may be a hydroxyl group, a thiol group, an alkoxysilyl group, etc., but is not limited thereto.

In order to have the above-described effects, a specific example of the acrylic compound (B) included in the resin composition according to the present invention may be one or more selected from diacrylate-based compounds such as 3,5,7,9-tetraoxa-4,6,8-trisilaundecane-1,11-diol dimethacrylate, 4,6,8-hexamethyl-3,5,7,9-tetraoxa-4,6,8-trisilaundecane-1,11-diol dimethacrylate, 4,6,8-trimethyl-4,6,8-triphenyl-3,5,7,9-tetraoxa-4,6,8-trisilaundecane-1,11-diol dimethacrylate, 1,4-cyclohexanedimethanol-1,4-diacrylate, diethyleneglycol diacrylate, triethyleneglycol dimethacrylate, triethyleneglycol diacrylate, polyethyleneglycol diacrylate, dipropylene glycol diacrylate, tripropylene glycol diacrylate, dimethylol tricyclodecane diacrylate, dimethylol tricyclodecane dimethacrylate, etc., and monoacrylate-based compounds such as 2-phenoxyethyl acrylate, 2-phenoxyethyl methacrylate, 3-phenoxybenzyl acrylate, 3-phenoxybenzyl methacrylate, phenoxy tetraethyleneglycol acrylate, phenoxy triethyleneglycol acrylate, phenoxy diethyleneglycol acrylate, phenoxy polyethyleneglycol acrylate, phenoxy tetraethyleneglycol methacrylate, phenoxy triethyleneglycol methacrylate, phenoxy diethyleneglycol methacrylate, methoxy polyethyleneglycol methacrylate, tetrahydrofuryl acrylate, cyclohexyl methacrylate, isobornyl acrylate, dicyclopentenyl acrylate, dicyclopentenyloxyethyl methacrylate, dicyclopentanyl acrylate, 3-(methacryloxypropyl) trimethoxysilane, 3-(acryloxypropyl)trimethoxysilane), etc.

In view of improvement of mutual miscibility of the compositions and improvement close-adhesion with the substrate, it is preferred to include two or more selected from 2-phenoxyethyl acrylate, tetrahydrofuryl acrylate, 3-(methacryloxypropyl)trimethoxysilane, 3-phenoxybenzyl acrylate, phenoxytetraethylene glycol acrylate, isobornyl acrylate, phenoxy diethylene glycol acrylate, 3-(methacryloxypropyl)trimethoxysilane, polyethylene glycol diacrylate, triethylene glycol dimethacrylate, 1,4-cyclohexanedimethanol-1,4-diacrylate, dimethylol tricyclodecane diacrylate, and dipropylene glycol diacrylate, etc.

Further, when wet etching is performed, it is preferred that post-baking is additionally performed to prevent undercut due to penetration of an etching solution. Here, the post-baking may be performed at normal temperature, preferably, 90 to 150° C., but the temperature of the post-baking is not limited thereto.

The resin composition according to the present invention may have excellent etching resistance and etching selectivity to form uniformly and evenly coated cured film, nanostructure, etc., and to form fine patterns by using various forms of molds, etc., or using the etching solution.

The resin composition according to the present invention may have excellent release property with a mold and may form transparent patterns having good surface film quality by mixing 30 to 60 wt % of the fluorine-based acrylic compound (A), 10 to 65 wt % of the acrylic compound (B), and 0.001 to 5 wt % of the photoinitiator (D). Here, the resin composition may further include 1 to 25 wt % of a compound (C) to be capable of excellently improving, in particular, etching resistance to carbon tetrafluoride ($CF_4$).

A viscosity of the resin composition having the above composition ratio according to an exemplary embodiment of the present invention is preferably 5 to 1000 cps (centipoise, 25° C.), but is not limited thereto. In order to further improve permeability of the resin in a mold for imprinting, it is preferred that the viscosity is 5 to 100 cps (25° C.), and more preferably, 5 to 20 cps (25° C.).

A shape, a size, etc., of concavo-convex patterns of the mold according to the present invention are not limited, and may be appropriately determined according to a shape, a size, etc., of patterns of a target cured film or a target nanostructure. A cross-sectional shape of each concave part in the concavo-convex patterns is not specifically limited, but may be varied, for example, in a square, a rectangle, a semicircle, a triangle, a shape similar to these shapes, an irregular shape, etc. Here, a depth of each concave part of the concavo-convex pattern is not specifically limited, but is preferably 1 nm to 100 μm, and a width of an opening part of each concave part is not specifically limited, but is preferably 1 nm to 100 μm.

The resin composition according to an exemplary embodiment of the present invention may further include a compound (C) which is a multifunctional photocrosslinking compound in view of increasing adhesion force with the substrate. The compound (C) may be mixed with the fluorine-based acrylic compound (A) and the acrylic compound (B), etc., that are mixed in the resin composition according to the present invention to remarkably improve close-adhesion force between the substrate and the resin composition and may have high miscibility with the fluorine-based acrylic compound (A) to exhibit excellent and uniform close-adhesion force at a heterogeneous interface. Specific examples of the compound (C) which is the multifunctional photocrosslinking compound may be one or more selected from trimethylolpropane tris(3-mercaptopropionate), tris(2-hydroxyethyl isocyanurate)triacrylate, trimethylolpropane triacrylate, trimethylolpropane trimethacrylate, pentaerythritol tetraacrylate, and dipentaerythritol hexaacrylate, etc., but is not limited thereto.

The present invention provides a method of forming patterns including: forming a fine pattern layer by applying a photocurable resin composition to one surface of a substrate and releasing the composition into a mold, the composition including a fluorine-based acrylic compound (A) represented by Chemical Formula 1, an acrylic compound (B) having one or two photopolymerizable functional group(s) in a molecule, and a photoinitiator (D); and photocuring by irradiating light to the fine pattern layer.

The resin composition according to an exemplary embodiment of the present invention further includes: a compound (C) having three or more functional groups selected from the photopolymerizable functional group in a molecule, and a functional group capable of reacting with the photopolymerizable functional group, which is preferred since it is able to minimize swelling or peeling phenomenon, etc., at an interface with a substrate.

Here, the acrylic compound (B) may be one or more selected from Chemical Formulas 2 and 3, and the compound (C) may be one or more selected from trimethylolpropane tris(3-mercaptopropionate), tris(2-hydroxyethyl isocyanurate)triacrylate, trimethylolpropane triacrylate, trimethylolpropane trimethacrylate, pentaerythritol tetraacrylate, and dipentaerythritol hexaacrylate, etc., but is not limited thereto.

Further, the photoinitiator (D) according to an exemplary embodiment of the present invention acts to photocure the resin composition, and is not limited as long as it is a general photoinitiator. Specific examples thereof may include one or more selected from benzionalkylether, benzophenone, benzyl dimethylkatal, hydroxycyclohexyl phenylacetone, chloroacetophenone, 1,1-dichloro acetophenone, diethoxy acetophenone, hydroxyl acetophenone, 2-chorothioxanthone, 2-ethylanthraquinone (2-ETAQ), 1-hydroxycyclohexyl phenyl ketone (Irgacure 184), 2-hydroxy-2-methyl-1-phenyl-1-propanone, 2-hydroxy-1-[4-(2-hydroxyethoxy)phenyl]-2-methyl-1-propanone, and methylbenzoylformate, etc., but is not limited thereto.

In the method of forming patterns according to an exemplary embodiment of the present invention, the coating is preferably performed by a method selected from spin coating, bar coating, spray coating, and inkjet coating, etc., and may be performed by general application methods.

The fine pattern layer formed by the method of forming patterns according to the present invention is not limited, but preferably has a dry applying thickness of 1 to 150 nm, preferably, 1 to 100 nm, and more preferably, 1 to 50 nm, which is preferred since it is able to minimize a residual layer after UV imprinting.

Hereinafter, the present invention is described in detail on the basis of Examples and Comparative Examples. Meanwhile, the following Examples are provided by way of example for explaining the present invention in more detail, and therefore, the present invention is not limited thereto.

Example 1

Preparation of Photocurable Resin Composition 1H,1H,4H,4H-perfluoro-1,4-butanediol diacrylate (47 g), phenoxyethyl acrylate (24 g), tetrahydrofuryl acrylate (23 g), 3-(methacryloxypropyl) trimethoxysilane (1 g), trimethylolpropane tris(3-mercaptopropionate) (1 g), and Irgacure 184 (4 g) were put into a Nalgene 100 ml PE container, and stirred at room temperature (25° C.) for 24 hours, thereby preparing a photocurable resin composition.

B. Method of Forming Patterns

The photocurable resin composition was spin-coated on a silicon wafer substrate (10 cm×10 cm) at a rotation speed of 3,000 rpm for 30 seconds. A urethane mold (mass 15 g, ground part 5 mm×5 mm) having rectangular patterns shown in FIG. 1 was mounted on the spin-coated substrate, and then, an entire surface was exposed for 3 minutes at an exposure amount of 13 mW/cm$^2$ (UV A standard) using a proximity exposure machine TME-150 PRC manufactured by Topcon Co., Ltd. The exposure amount was measured by using an integrating light-meter UIT-102 manufactured by Ushio Electric Co., Ltd., and a receiver UVD-365PD. After the exposure, the mold was removed, and post-baked in an oven at 120° C. for 5 minutes to form patterns (dry coating thickness=5 μm).

Physical properties of the patterns manufactured by the method as described above were measured as follows, and shown in Table 1 below.

Evaluation of Coating Property

States before and after the curing were confirmed using a scanning electron microscope (SEM, Hitachi S-4700). Here, when a material having poor miscibility was used, comb patterns were confirmed at the time of spin coating, but the present invention had a clear film quality without the comb patterns.

2) Measurement of Viscosity

For measuring the viscosity of the photocurable resin composition, an initial viscosity (based on 25° C.) was measured using a DV-II+VISCOMETER (Brookfield) at 41 spindle/30 rpm. The measurement amount (3 mL) was the same, and an error was minimized by measuring the viscosity in a state in which there were no bubbles.

3) Measurement of Etching Resistance

For confirming etching resistance, a thickness was confirmed by Alpha-step by etching through inductively coupled plasma (ICP) equipment. A gas for etching was $CF_4$, and the etching was performed three times (i.e., primary, secondary, and tertiary etchings) in the same equipment under the same conditions. The thickness after etching was measured 3 times continuously and an average value was used. The etched thickness and etching time (min) were confirmed to calculate the etching resistance according to the following equation, and expressed as an average value of the primary, secondary, and tertiary etchings.

Etching resistance=(etched thickness (um)/etching time (min))

Example 2

Preparation of Photocurable Resin Composition 1H,1H,11H,11H-perfluoro-3,6,9-trioxaundecane-1,11-diol diacrylate (38 g), 4,6,8-hexamethyl-3,5,7,9-tetraoxa-4,6,8-trisilaundecane-1,11-diol dimethacrylate (31 g), polyethyleneglycol diacrylate (13 g), triethyleneglycol dimethacrylate (13 g), 3-(methacryloxypropyl)trimethoxysilane (1 g), and Irgacure 184 (4 g) were put into a Nalgene 100 ml PE container, and stirred at room temperature for 24 hours, thereby preparing a photocurable resin composition.

B. Method of Forming Patterns

Patterns were formed under the same condition as step B of Example 1 except for using the photocurable resin composition prepared in Example 2 rather than using the photocurable resin composition prepared in Example 1, and physical properties thereof were measured and shown in Table 1 below.

Example 3

Preparation of Photocurable Resin Composition 1H,1H,11H,11H-perfluoro-3,6,9-trioxaundecane-1,11-diol diacrylate (45 g), 1,4-cyclohexanedimethanol-1,4-diacrylate (32 g), polyethyleneglycol diacrylate (5 g), triethyleneglycol dimethacrylate (13 parts by weight), 3-(methacryloxypropyl)trimethoxysilane (1 g), and Irgacure 184 (4 g) were put into a Nalgene 100 ml PE container, and stirred at room temperature for 24 hours, thereby preparing a photocurable resin composition.

B. Method of Forming Patterns

Patterns were formed under the same condition as step B of Example 1 except for using the photocurable resin composition prepared in Example 3 rather than using the photocurable resin composition prepared in Example 1, and physical properties thereof were measured and shown in Table 1 below.

Example 4

Preparation of Photocurable Resin Composition

A photocurable resin composition was prepared under the same conditions as Example 3 except for using 3-phenoxybenzyl acrylate rather than using triethyleneglycol dimethacrylate in the photocurable resin composition of Example 3.

B. Method of Forming Patterns

Patterns were formed under the same condition as step B of Example 1 except for using the photocurable resin composition prepared in Example 4 rather than using the photocurable resin composition prepared in Example 1, and physical properties thereof were measured and shown in Table 1 below.

Example 5

Preparation of Photocurable Resin Composition 1H,1H,11H,11H-perfluoro-3,6,9-trioxaundecane-1,11-diol diacrylate (45 g), 1,4-cyclohexanedimethanol-1,4-diacrylate (16 g), phenoxy tetraethyleneglycol acrylate (5 g), 3-phenoxybenzyl acrylate (29 g), 3-(methacryloxypropyl)trimethoxysilane (1 g), and Irgacure 184 (4 g) were put into a Nalgene 100 ml PE container, and stirred at room temperature for 24 hours, thereby preparing a photocurable resin composition.

B. Method of Forming Patterns

Patterns were formed under the same condition as step B of Example 1 except for using the photocurable resin composition prepared in Example 5 rather than using the photocurable resin composition prepared in Example 1, and physical properties thereof were measured and shown in Table 1 below.

Example 6

Preparation of Photocurable Resin Composition 1H,1H,11H,11H-perfluoro-3,6,9-trioxaundecane-1,11-diol diacrylate (40 g), dimethylol tricyclodecane diacrylate (10 g), isobornyl acrylate (26 g), phenoxy diethyleneglycol acrylate (20 g), and Irgacure 184 (4 g) were put into a Nalgene 100 ml PE container, and stirred at room temperature for 24 hours, thereby preparing a photocurable resin composition.

B. Method of Forming Patterns

Patterns were formed under the same condition as step B of Example 1 except for using the photocurable resin composition prepared in Example 6 rather than using the photocurable resin composition prepared in Example 1, and physical properties thereof were measured and shown in Table 1 below.

Example 7

Preparation of Photocurable Resin Composition 1H,1H,11H,11H-perfluoro-3,6,9-trioxaundecane-1,11-diol diacrylate (41 g), dimethylol tricyclodecane diacrylate (5 g), dipropyleneglycol diacrylate (35 g), dipentaerythritol hexaacrylate (DPHA) (1 g), phenoxy diethyleneglycol acrylate (14 g), and Irgacure 184 (4 g) were put into a Nalgene 100 ml PE container, and stirred at room temperature for 24 hours, thereby preparing a photocurable resin composition.

B. Method of Forming Patterns

Patterns were formed under the same condition as step B of Example 1 except for using the photocurable resin composition prepared in Example 7 rather than using the photocurable resin composition prepared in Example 1, and physical properties thereof were measured and shown in Table 1 below.

Comparative Example 1

Preparation of Photocurable Resin Composition 1H, 1H,4H,4H-perfluoro-1,4-butanediol diacrylate (10 g), phenoxyethyl acrylate (61 g), tetrahydrofuryl acrylate (23 g), methacryloxypropyl trimethoxysilane (1 g), trimethylolpropane tris(3-mercaptopropionate) (1 g), and Irgacure 184 (4 g) were put into a Nalgene 100 ml PE container, and stirred at room temperature for 24 hours, thereby preparing a photocurable resin composition.

B. Method of Forming Patterns

Patterns were formed under the same condition as step B of Example 1 except for using the photocurable resin composition prepared in Comparative Example 1 rather than using the photocurable resin composition prepared in Example 1, and physical properties thereof were measured and shown in Table 1 below.

Comparative Example 2

Preparation of Photocurable Resin Composition 1H,1H,4H,4H-perfluoro-1,4-butanediol diacrylate (70 g), phenoxyethyl acrylate (10 g), tetrahydrofuryl acrylate (14 g), methacryloxypropyl trimethoxysilane (1 g), trimethylolpropane tris(3-mercaptopropionate) (1 g), and Irgacure 184 (4 g) were put into a Nalgene 100 ml PE container, and stirred at room temperature for 24 hours, thereby preparing a photocurable resin composition.

B. Method of Forming Patterns

Patterns were formed under the same condition as step B of Example 1 except for using the photocurable resin composition prepared in Comparative Example 2 rather than using the photocurable resin composition prepared in Example 1, and physical properties thereof were measured and shown in Table 1 below.

Comparative Example 3

Preparation of Photocurable Resin Composition

A photocurable resin composition was prepared by the same method as Example 1 except for using 1,4-butanediol diacrylate (CAS number:1070-70-8) rather than using 1H,1H,4H,4H-perfluoro-1,4-butanediol diacrylate of Example 1.

B. Method of Forming Patterns

Patterns were formed under the same condition as in B of Example 1 except for using the photocurable resin composition prepared in Comparative Example 3 rather than using the photocurable resin composition prepared in Example 1, and physical properties thereof were measured and shown in Table 1 below.

TABLE 1

| | Coating property | Viscosity (cps) | $CF_4$ etching resistance (um/min) | Release property |
|---|---|---|---|---|
| Example 1 | Clear | 8.0 | 0.28 | ○ |
| Example 2 | Clear | 12.5 | 0.27 | ○ |
| Example 3 | Clear | 19.3 | 0.38 | ○ |
| Example 4 | Clear | 20.6 | 0.40 | ○ |
| Example 5 | Clear | 16.0 | 0.45 | ○ |
| Example 6 | Clear | 13.5 | 0.50 | ○ |
| Example 7 | Clear | 12.5 | 0.31 | ○ |
| Comparative Example 1 | Comb patterns were shown | 9.5 | 0.52 | X |
| Comparative Example 2 | Comb patterns were shown | 8.2 | 0.58 | X |
| Comparative Example 3 | Comb patterns were shown | 9.2 | 0.60 | X |

As shown in Table 1, it could be appreciated that when the compound represented by Chemical Formula 1 was not used like Comparative Example 3, or when the photocurable resin composition out of the composition ratio of the present invention was used like Comparative Examples 1 and 2, the release property with the imprint mold was poor, and the etching resistance with regard to the carbon tetrafluoride was remarkably reduced. In addition, it could be appreciated that it was not possible to implement the clear film quality even in the evaluation of the coating property.

On the contrary, as shown in Examples 1 to 7, it could be appreciated that when the composition and the composition ratio of the present invention were satisfied, the release property with the imprint mold was excellent, and close-adhesion force with the substrate was also remarkably improved. In particular, as shown in the Examples, it could be confirmed that when the resin composition included 38 to 45 parts by weight of the fluorine-based acrylic compound (A), it was possible to form patterns having the film quality with high reliability.

The invention claimed is:

1. A method of forming patterns comprising:
forming a fine pattern layer by applying a photocurable resin composition to one surface of a substrate and releasing the composition into a mold, the composition including 30 to 60 wt % of a fluorine-based acrylic compound (A) represented by Chemical Formula 1 below, 10 to 65 wt % of an acrylic compound (B) having one or two photopolymerizable functional group(s) in a molecule, and 0.001 to 5 wt % of a photoinitiator (D); and
photocuring by irradiating light to the fine pattern layer, wherein the acrylic compound (B) includes an acrylic compound represented by Chemical Formula 3 below:

[Chemical Formula 1]

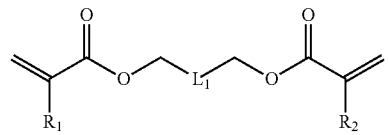

in Chemical Formula 1,
$R_1$ and $R_2$ are each independently hydrogen or (C1-C10)alkyl; and
$L_1$ is —$CF_2(OCF_2CF_2)_m$—$OCF_2$—, and m is an integer selected from 1 to 5, and

[Chemical Formula 3]

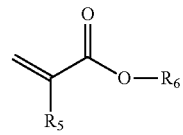

in Chemical Formula 3,
$R_5$ is hydrogen or (C1-C10)alkyl;
$R_6$ is (C1-C10)alkyl, (C3-C20)cycloalkyl, (C3-C20)heterocycloalkyl, (C6-C20)aryl(C1-C10)alkyl, (C6-C20)aryl, (C3-C20)heteroaryl, di(C1-C10)alkylsilyl, tri(C1-C10)alkylsilyl, di(C1-C10)alkoxysilyl, tri(C1-C10)alkoxysilyl, di(C1-C10)alkyl(C6-C20)arylsilyl, or tri(C6-C20)arylsilyl; and
the alkyl, aryl-substituted alkyl, cycloalkyl, heterocycloalkyl, aryl, alkylaryl, heteroaryl, trialkylsilyl, dialkylarylsilyl, and triarylsilyl of $R_6$ are each independently substituted with —Si—$(OR_{21})_3$, wherein $R_{21}$ is (C1-C10)alkyl or (C3-C20)cycloalkyl.

2. The method of claim 1, wherein the applying is performed by a method selected from spin coating, bar coating, spray coating, and ink jet coating.

3. The method of claim 1, wherein a dry application thickness of the fine pattern layer is 1 to 150 nm.

4. The method of claim 1, wherein the composition further includes a compound (C) having three or more functional groups selected from the photopolymerizable functional group in a molecule, and a functional group capable of reacting with the photopolymerizable functional group.

* * * * *